(12) United States Patent
Lin

(10) Patent No.: US 7,570,054 B1
(45) Date of Patent: Aug. 4, 2009

(54) DYNAMIC MAGNETIC RESONANCE INVERSE IMAGING USING LINEAR CONSTRAINED MINIMUM VARIANCE BEAMFORMER

(75) Inventor: Fa-Hsuan Lin, Brookline, MA (US)

(73) Assignee: The General Hospital Corporation, Boston, MA (US)

( * ) Notice: Subject to any disclaimer, the term of this patent is extended or adjusted under 35 U.S.C. 154(b) by 0 days.

(21) Appl. No.: 12/114,326

(22) Filed: May 2, 2008

Related U.S. Application Data

(63) Continuation-in-part of application No. 11/484,091, filed on Jul. 11, 2006, now Pat. No. 7,394,251.

(60) Provisional application No. 60/745,218, filed on Apr. 20, 2006.

(51) Int. Cl.
*G01V 3/00* (2006.01)
(52) U.S. Cl. .................. 324/309; 324/307
(58) Field of Classification Search ......... 324/300–322; 600/407–445; 382/260, 131
See application file for complete search history.

(56) References Cited

U.S. PATENT DOCUMENTS

| 5,263,488 | A * | 11/1993 | Van Veen et al. ............ 600/544 |
| 6,697,660 | B1 * | 2/2004 | Robinson ..................... 600/409 |
| 6,777,934 | B2 * | 8/2004 | Takahashi et al. ............ 324/309 |
| 7,005,853 | B2 * | 2/2006 | Tsao et al. ..................... 324/309 |
| 7,394,251 | B2 * | 7/2008 | Lin ............................... 324/309 |
| 2008/0129298 | A1 * | 6/2008 | Vaughan et al. ............. 324/322 |
| 2008/0310695 | A1 * | 12/2008 | Garnier et al. .............. 382/131 |
| 2009/0009167 | A1 * | 1/2009 | Du ............................... 324/307 |

OTHER PUBLICATIONS

Ching-Yih Tseng, et al. "A Unified Approach to the Design of Linear Constraints in Minimum Variance Adaptive Beamformers" (1992) IEEE Transactions on Antennas and Propagation, vol. 40, No. 12: 1533-1542.

Cristian-George Benar "Combining Magnetic Resonance Imaging and Electroencephalography in the Investigation of Interictal Epileptic Spikes" Department of Biomedical Engineering McGill University, Montreal, Canada Aug. 2004.

Fa-Hsuan Lin et al. "Dynamic Magnetic Resonance Inverse Imaging of Human Brain Function" Submitted to Magnetic Resonance in Medicine, Nov. 7, 2005.

* cited by examiner

*Primary Examiner*—Brij B Shrivastav
(74) *Attorney, Agent, or Firm*—Quarles & Brady LLP

(57) ABSTRACT

An fMRI scan is performed using a multi-element head coil and multi-channel receiver to acquire time course image data. One imaging gradient is eliminated from the pulse sequence used to acquire the time course image data enabling images to be acquired at a very high frame rate. The multi-channel NMR data is combined and reconstructed into a series of image frames using a spatial filter calculated using a linear constrained minimum variance (LCMV) beamforming method.

15 Claims, 7 Drawing Sheets

DYNAMIC MAGNETIC RESONANCE INVERSE IMAGING USING LINEAR CONSTRAINED MINIMUM VARIANCE BEAMFORMER

CROSS-REFERENCE TO RELATED APPLICATIONS

This application is a continuation-in-part of U.S. patent application Ser. No. 11/484,091 filed on Jul. 11, 2006 now U.S. Pat. No. 7,394,251 and entitled "Dynamic Magnetic Resonance Inverse Imaging", which claims the benefit of U.S. Provisional Patent Application Ser. No. 60/745,218, filed Apr. 20, 2006. This application further claims the benefit of U.S. Provisional Patent Application Ser. No. 60/927,357 filed on May 3, 2007, and entitled "Dynamic Magnetic Resonance Inverse Imaging Using Linear Constrained Minimum Variance Beamformer".

STATEMENT REGARDING FEDERALLY SPONSORED RESEARCH

This invention was made with United States government support awarded by the following agencies: NIH R01 HD040712, NIH R01 NS037462, and NIH P41 RR14075. The United States has certain rights in this invention.

BACKGROUND OF THE INVENTION

The field of the invention is nuclear magnetic resonance imaging (MRI) methods and systems. More particularly, the invention relates to dynamic studies in which a series of MR images are acquired at a high temporal resolution.

When a substance such as human tissue is subjected to a uniform magnetic field (polarizing field $B_0$), the individual magnetic moments of the excited nuclei in the tissue attempt to align with this polarizing field, but precess about it in random order at their characteristic Larmor frequency. If the substance, or tissue, is subjected to a magnetic field (excitation field $B_1$) that is in the x-y plane and that is near the Larmor frequency, the net aligned moment, $M_z$, may be rotated, or "tipped", into the x-y plane to produce a net transverse magnetic moment $M_t$. A signal is emitted by the excited nuclei or "spins", after the excitation signal $B_1$ is terminated, and this signal may be received and processed to form an image.

When utilizing these "MR" signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received MR signals are digitized and processed to reconstruct the image using one of many well known reconstruction techniques.

The measurement cycle used to acquire each MR signal is performed under the direction of a pulse sequence produced by a pulse sequencer. Clinically available MRI systems store a library of such pulse sequences that can be prescribed to meet the needs of many different clinical applications. Research MRI systems include a library of clinically proven pulse sequences and they also enable the development of new pulse sequences.

The MR signals acquired with an MRI system are signal samples of the subject of the examination in Fourier space, or what is often referred to in the art as "k-space". Each MR measurement cycle, or pulse sequence, typically samples a portion of k-space along a sampling trajectory characteristic of that pulse sequence. Most pulse sequences sample k-space in a roster scan-like pattern sometimes referred to as a "spin-warp", a "Fourier", a "rectilinear" or a "Cartesian" scan. The spin-warp scan technique is discussed in an article entitled "Spin-Warp MR Imaging and Applications to Human Whole-Body Imaging" by W. A. Edelstein et al., Physics in Medicine and Biology, Vol. 25, pp. 751-756 (1980). It employs a variable amplitude phase encoding magnetic field gradient pulse prior to the acquisition of MR spin-echo signals to phase encode spatial information in the direction of this gradient. In a two-dimensional implementation (2DFT), for example, spatial information is encoded in one direction by applying a phase encoding gradient ($G_y$) along that direction, and then a spin-echo signal is acquired in the presence of a readout magnetic field gradient ($G_x$) in a direction orthogonal to the phase encoding direction. The readout gradient present during the spin-echo acquisition encodes spatial information in the orthogonal direction. In a typical 2DFT pulse sequence, the magnitude of the phase encoding gradient pulse $G_y$ is incremented ($\Delta G_y$) in the sequence of measurement cycles, or "views" that are acquired during the scan to produce a set of k-space MR data from which an entire image can be reconstructed.

There are many other k-space sampling patterns used by MRI systems These include "radial", or "projection reconstruction" scans in which k-space is sampled as a set of radial sampling trajectories extending from the center of k-space as described, for example, in U.S. Pat. No. 6,954,067. The pulse sequences for a radial scan are characterized by the lack of a phase encoding gradient and the presence of a readout gradient that changes direction from one pulse sequence view to the next. There are also many k-space sampling methods that are closely related to the radial scan and that sample along a curved k-space sampling trajectory rather than the straight line radial trajectory. Such pulse sequences are described, for example, in "Fast Three Dimensional Sodium Imaging", MRM, 37:706-715, 1997 by F. E. Boada, et al. and in "Rapid 3D PC-MRA Using Spiral Projection Imaging", Proc. Intl. Soc. Magn. Reson. Med. 13 (2005) by K. V. Koladia et al and "Spiral Projection Imaging: a new fast 3D trajectory", Proc. Intl. Soc. Mag. Reson. Med. 13 (2005) by J. G. Pipe and Koladia.

An image is reconstructed from the acquired k-space data by transforming the k-space data set to an image space data set. There are many different methods for performing this task and the method used is often determined by the technique used to acquire the k-space data. With a Cartesian grid of k-space data that results from a 2D or 3D spin-warp acquisition, for example, the most common reconstruction method used is an inverse Fourier transformation ("2DFT" or "3DFT") along each of the 2 or 3 axes of the data set. With a radial k-space data set and its variations, the most common reconstruction method includes "regridding" the k-space samples to create a Cartesian grid of k-space samples and then perform a 2DFT or 3DFT on the regridded k-space data set. In the alternative, a radial k-space data set can also be transformed to Radon space by performing a 1DFT of each radial projection view and then transforming the Radon space data set to image space by performing a filtered backprojection.

To reduce the time needed to acquire data for an MR image multiple NMR signals may be acquired in the same pulse sequence. The echo-planar pulse sequence was proposed by Peter Mansfield (J. Phys. C. 10: L55-L58, 1977). In contrast to standard pulse sequences, the echo-planar pulse sequence produces a set of NMR signals for each RF excitation pulse. These NMR signals can be separately phase encoded so that an entire scan of 64 views can be acquired in a single pulse sequence of 20 to 100 milliseconds in duration. The advantages of echo-planar imaging ("EPI") are well-known, and this method is commonly used where the clinical application requires a high temporal resolution. Echo-planar pulse sequences are disclosed in U.S. Pat. Nos. 4,678,996; 4,733,188; 4,716,369; 4,355,282; 4,588,948 and 4,752,735.

A variant of the echo-planar imaging method is the Rapid Acquisition Relaxation Enhanced (RARE) sequence which is described by J. Hennig et al in an article in Magnetic Resonance in Medicine 3,823-833 (1986) entitled "RARE Imaging: A Fast Imaging Method for Clinical MR." The essential difference between the RARE (also called a fast spin-echo or FSE) sequence and the EPI sequence lies in the manner in which NMR echo signals are produced. The RARE sequence, utilizes RF refocused echoes generated from a Carr-Purcell-Meiboom-Gill sequence, while EPI methods employ gradient recalled echoes.

Other MRI pulse sequences are known which sample 2D or 3D k-space without using phase encoding gradients. These include the projection reconstruction methods known since the inception of magnetic resonance imaging and again being used as disclosed in U.S. Pat. No. 6,487,435. Rather than sampling k-space in a rectilinear, or Cartesian, scan pattern by stepping through phase encoding values as described above and shown in FIG. 2, projection reconstruction methods sample k-space with a series of views that sample radial lines extending outward from the center of k-space as shown in FIG. 3. The number of projection views needed to sample k-space determines the length of the scan and if an insufficient number of views are acquired, streak artifacts are produced in the reconstructed image. There are a number of variations of this straight line, radial sampling trajectory in which a curved path is sampled. These include spiral projection imaging and propeller projection imaging.

Recently, parallel MRI scanning methods using spatial information derived from the spatial distribution of the receive coils and a corresponding number of receiver channels has been proposed to accelerate MRI scanning. This includes the k-space sampling methods described in Sodickson D K, Manning W J, "Simultaneous Acquisition Of Spatial Harmonics (SMASH)" Fast Imaging With Radiofrequency Coil Arrays", Magn. Reson. Med. 1997; 38(4):591-603, or Griswold M A, Jacob P M, Heidemann R M, Nittka M, Jellus V, Wang J, Kiefer B, Hasse A, "Generalized Autocalibrating Partially parallel Acquisitions (GRAPPA)", Magn. Reson. Med. 2002; 47(6):1202-1210, or Pruessmann K P, Weiger M, Scheidegger M B, Boesiger P, "SENSE: Sensitivity Encoding For Fast MRI", Magn. Reson. Med. 1999; 42(5):952-962, all of which share a similar theoretical background. Parallel MRI accelerates image data acquisition at the cost of reduced signal-to-noise ratio (SNR). The temporal acceleration rate is limited by the number of coils in the array and the number of separate receive channels, and the phase-encoding schemes used. Typically, acceleration factors of 2 or 3 are achieved.

Mathematically, the attainable acceleration in parallel MRI is limited by the available independent spatial information among the channels in the array. The parallel MRI image reconstruction manifests itself as a problem in solving an over-determined linear system using this spatial information. Therefore, advances in the coil array design with more coil elements and receiver channels can increase the acceleration rate when using the parallel MRI technique. Recently, optimized head coil arrays have been extended from 8-channel as described in de Zwart J A, Ledden P J, Kellman P, van Gelderen P, Duyn J H, "Design Of A SENSE-Optimized High-Sensitivity MRI Receive Coil For Brain Imaging", Magn. Reson. Med. 2002; 47(6):1218-1227, to 16-channel as described in de Zwart J A, Ledden P J, van Gelderen P, Bodurka J, Chu R, Duyn J H, "Signal-To-Noise Ratio And Parallel Imaging Performance Of A 16-Channel Receive-Only Brain Coil Array At 3.0 Tesla", Magn. Reson. Med. 2004; 51(1):22-26, as well as 23 and 90-channel arrays as described in Wiggins G C, Potthast A, Triantafyllou C, Lin F-H, Benner T, Wiggins C J, Wald L L, "A 96-Channel MRI System With 23- and 90-Channel Phase Array Head Coils At 1.5 Tesla", 2005; Miami, Fla., USA, International Society for Magnetic Resonance in Medicine, p. 671.

As described recently by McDougall M P, Wright S M, "64-Channel Array Coil For Single Echo Acquisition Magnetic Resonance Imaging", Magn. Reson. Med. 2005; 54(2):386-392, a dedicated 64-channel linear planar array was developed to achieve 64-fold acceleration using a single echo acquisition (SEA) pulse sequence and a SENSE reconstruction method. The SEA approach depends on the linear array layout and localized RF coil sensitivity in individual receiver channels to eliminate the phase encoding steps required in conventional imaging. The challenge of this approach is the limited sensitivity in the perpendicular direction to the array plane and the extension of the methodology to head-shaped geometries.

In co-pending U.S. patent application Ser. No. 11/484,091 filed on Jul. 11, 2006 and entitled "Dynamic Magnetic Resonance Inverse Imaging", a method is described which is capable of extremely fast data acquisition due to the minimal gradient cycling used for spatial encoding. Similar to the problems encountered when using classical source localization techniques with MEG and EEG data sources, an inverse operator is required to estimate the spatial distribution of signal changes and their associated statistical significance in magnetic resonance InI. Due to the limited amount of independent information from each RF coil channel and the large number of sources to be estimated, an inverse problem of this type is generally ill-posed, indicating that there exist an infinite number of solutions satisfying the physical relationship between the underlying sources and the detected signals, the so called forward solution. In order to obtain a unique solution, additional constraints must be applied in solving this ill-posed inverse problem.

In MEG and EEG research, a commonly used constraint involves the simplifying assumption that a limited number of focal sources can account for the observed electromagnetic signals. This is the equivalent-current-dipole (ECD) approach, used extensively for discrete and focal source localization in applications such as epileptic spike localization. One major challenge encountered in ECD source modeling is that the number of dynamic sources (ECDs) must be specified a priori, possibly inducing bias in the apparent location or temporal modulation of the estimated sources. Additionally, the computational cost of ECD source localization will grow rapidly when the number of assumed sources increases from one to only a few. In the context of fMRI, the assumption that combinations of a limited number of focal dynamic sources can adequately account for the observed signal modulations does not have much validity.

The basic principle employed in spatial filtering involves passing dynamic sources from a specified location while suppressing activity from all other signal source locations. One particular spatial filtering technique falls in the category of linear constraint minimal variance (LCMV) filtering, also called "beamforming" (Van Veen, BD, et al., "Localization of brain electrical activity via linearly constrained minimum variance spatial filtering", IEEE Trans. Biomed. Engr., 1997; 44:867-880). Originally developed for radar and sonar processing to allow modulation of the sensitivity profile of radar arrays (Van Veen, B. D., Buckley, K., "Beamforming: A Versatile Approach to Spatial Filtering", IEEE ASSP Magazine, 1988; 5:4-24), LCMV beamforming has most recently been applied to the problem of MEG and EEG source localization. One example is the synthetic aperture magnetometery (SAM) approach, which automatically estimates the orientation of individual current dipoles in the design of the spatial filter (Robinson, S. E., Vrba, J., 1999. Functional neuroimaging by synthetic aperture magnetometry (SAM). Tohoku University Press, Sendai). LCMV and SAM have both been utilized in MEG and EEG studies utilizing time domain (Gaetz, W. C., Cheyne, D. O., 2003. Localization of human somatosensory cortex using spatially filtered magnetoencephalography. Neurosci Lett 340, 161-164; Sekihara, K., et al., 2001. Reconstructing spatio-temporal activities of neural sources using an MEG vector beamformer technique. IEEE Trans Biomed Eng 48, 760-771) as well as spectral domain (Gross, J., et al., 2001. Dynamic imaging of coherent sources: Studying neural interactions in the human brain. Proc Natl Acad Sci USA 98, 694-699; Taniguchi et al., 2000. Movement-related desynchronization of the cerebral cortex studied with spatially filtered magnetoencephalography. Neuroimage 12, 298-306) analysis. LCMV and SAM beamformers have also been used for statistical inference in MEG/EEG localization (Barnes, G. R., Hillebrand, A., 2003. Statistical flattening of MEG beamformer images. Hum Brain Mapp 18, 1-12; Chau et al., 2004. Detection of power changes between conditions using split-half resampling of synthetic aperture magnetometry data. Neurol Clin Neurophysiol 2004, 24). However, none of these spatial filtering methods have been applied to the problem of fMRI signal detection.

SUMMARY OF THE INVENTION

The present invention overcomes the drawbacks of prior methods by providing a spatial filtering method for acquiring MR image data and for reconstructing images from such data that enables the elimination of one or more imaging gradients. More specifically, the present invention is a method that obtains spatially distributed estimates of task-related dynamic signal changes and their associated statistical significance. The method includes acquiring NMR data from the field of view using multiple coils and corresponding multiple receive channels and combining the data from the multiple coils using an imaging inverse operator that employs a linear constrained minimum variance (LCMV) beamformer, which minimizes the point spread function of the reconstructed kernel by suppressing signal leakage from all image voxels other than the one being reconstructed.

A general object of the invention is to shorten scan time by reducing reliance on imaging gradients. By eliminating one, two or three imaging gradients using the present invention, the pulse sequence used to acquire NMR image data is shortened and the number of repetitions of the pulse sequence is either reduced or eliminated altogether. Unlike prior parallel MRI imaging methods, the imaging inverse operator also allows reconstruction in the underdetermined case: where the rate of the accelerated image exceeds the number of RF array channels. For example, if in rate=4 SENSE, ¼ of the k-space data needed for an unaliased image is sampled with 8 receive channels. In the present invention, the effective Rate (reciprocal of the ratio of sampled k-space points to that needed for an unaliased reconstruction), can exceed the number of RF array channels present. If the gradient encoding is completely eliminated (one k-space sample) then the present invention can generate an image solely using the spatial information in the array of multiple receive coils.

Another object of the invention is to increase the temporal resolution in dynamic MRI studies. By using the present invention phase encoding can be eliminated from an fMRI pulse sequence and image frames can be acquired at a very high frame rate. As a result, the time resolution of the resulting time course fMRI data is much higher.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

GENERAL DESCRIPTION OF THE INVENTION

Figure 1:
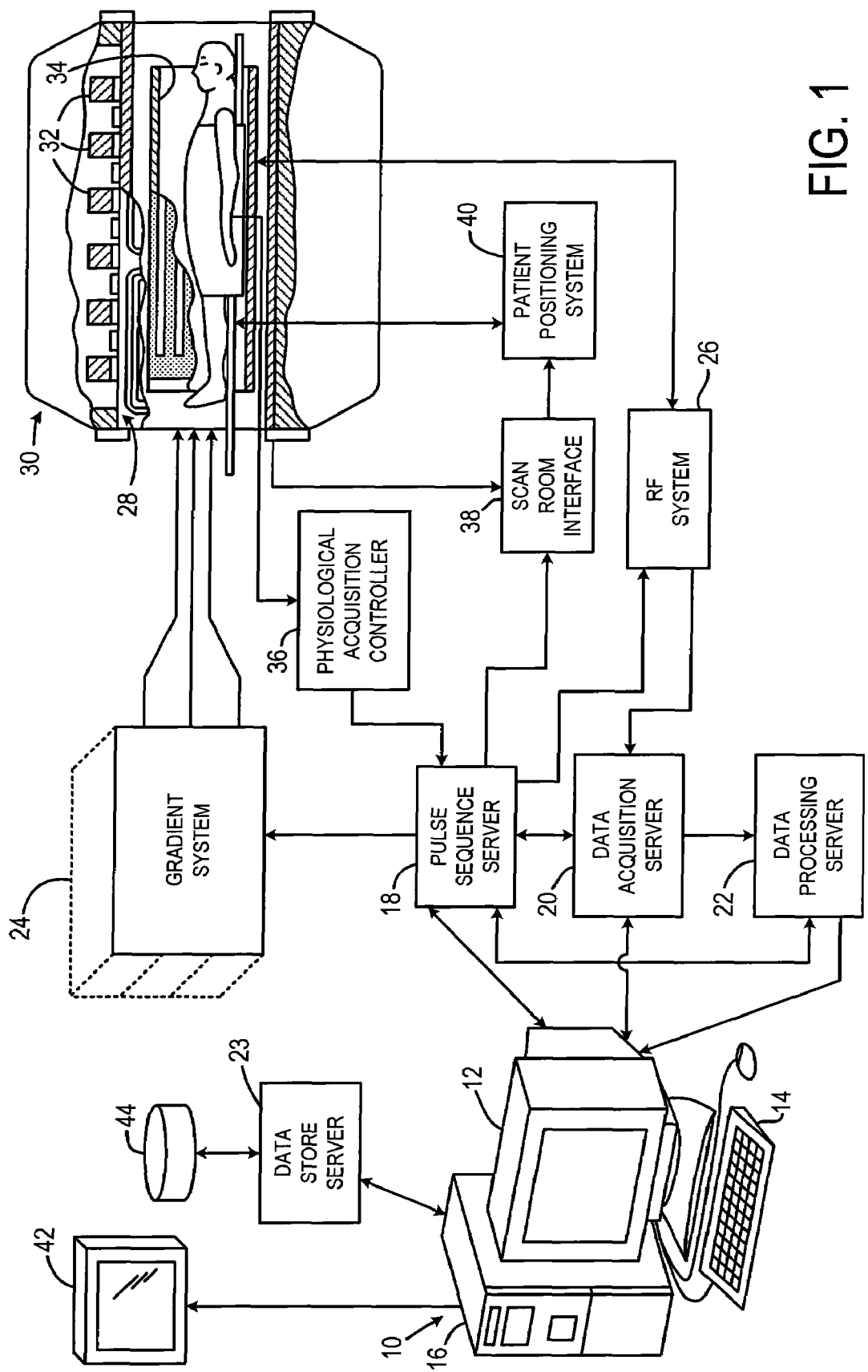
FIG. 1 is a block diagram of an MRI system which employs the present invention.
Figure 2:
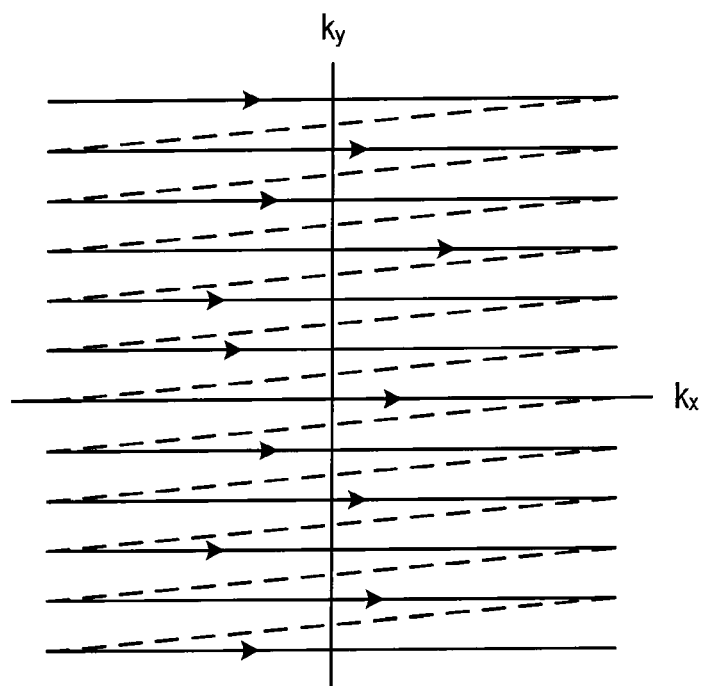
FIG. 2 is a graphic illustration of the Cartesian, or Fourier k-space sampling pattern.
Figure 3:
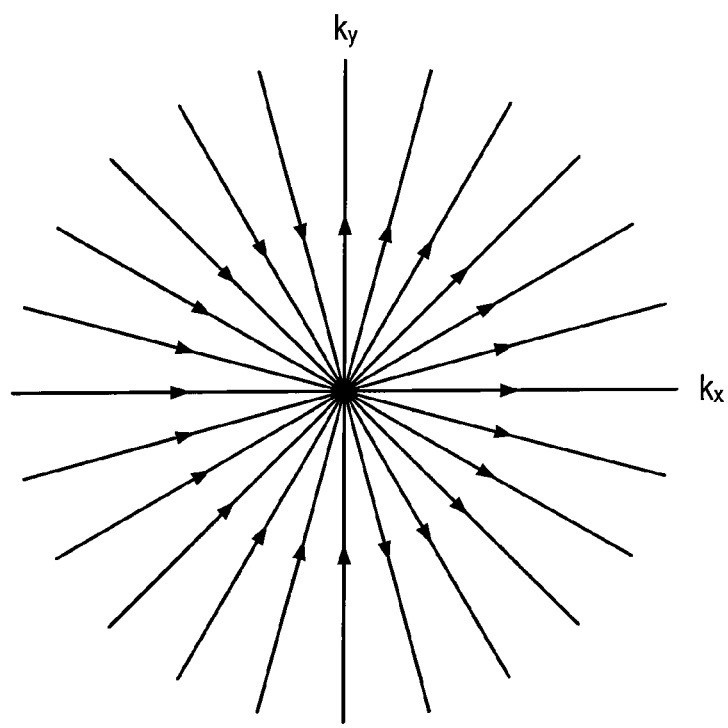
FIG. 3 is a graphic illustration of a radial, or projection reconstruction k-space sampling pattern.

The present invention employs an RF coil array with separate coil elements positioned at different locations relative to the subject positioned in the field of view (FOV). Each coil element receives an NMR echo signal which is separately amplified, digitized and processed according to the present invention to reconstruct an image.

The generation of time series image on an $n_c$-channel RF coil array in MRI can be formulated as:

$$y(t)=Ax(t)+n(t), \qquad (1)$$

where t indicates time, y(t) is an $(n_a \cdot n_c)$-by-1 vector with $n_a$ vertical stacks (of k-space samples) with $n_c$ observations (number of array channels), x(t) is an $n_p$-by-1 vector denoting the image to be reconstructed, n(t) is a $(n_a \cdot n_c)$-by-1 vector denoting the contaminating noise in the coils, and A is the "forward operator", which maps the signals to the coil array observations. Here we introduce the symbol r to indicate the "acceleration rate", the ratio between the number of fully sampled k-space data ($n_p$) and the number of k-space samples in the accelerated dynamic scan ($n_a$). Usually $n_a \leq n_p$. In Fourier MR imaging, the forward operator for the $n^{th}$ coil in the array can be further decomposed into Fourier encoding part (E) and coil sensitivity modulation part ($P_n$):

$$A_n = EP_n, n = 1 \ldots n_c, A = \begin{bmatrix} A_1 \\ \vdots \\ A_n \end{bmatrix}. \quad (2)$$

The coil sensitivity describes how the spin density is modulated by the reception profile of each coil element in the RF coil array; it is thus different among the coils in the array. The Fourier encoding matrix, however, is identical for all coils in the array due to the same applied gradients. Given the k-space trajectory $E = \Phi_{n_a}^{-1} S \Phi_{n_p}$, where S is the sampling matrix of size $n_a$-by-$n_p$ consisting of row vectors of the discrete data delta function. In the $i^{th}$ row of S, the $j^{th}$ element is 1 if the k-space spatially indexed entry j is sampled, and 0 everywhere else. Here, $\Phi_{n_p}$ is the discrete Fourier transform matrix of size $n_p$. In addition, off-resonance phase information can also be incorporated and thus a "phase-constrained" forward problem is formulated by factoring out the real and imaginary parts. The purpose of the phase-constrained forward problem is to enable dynamic statistical inference with either positive or negative values to infer the MR signal to be higher or lower than the baseline signal. This is because x(t) is explicitly constrained to be a real-valued vector, the details of which are described below.

In an ensemble of parallel MRI acquisitions, the noise can be characterized with a noise covariance matrix, C. The forward problem is first "whitened" to facilitate the formulation without a loss of generality. Employing the Cholesky decomposition of the noise covariance matrix, C, the whitened forward equation is written:

$$y_w(t) = A_w x(t) + n_w(t), \quad (3a)$$

$$y_w(t) = C^{1/2} y(t), \quad (3b)$$

$$A_w(t) = C^{1/2} A, \quad (3c)$$

$$\langle n_w(t) n_w(t)^H \rangle = I_{n_c} \quad (3d)$$

Where $(\ldots)^H$ indicates the Hermitian transpose operator, $\langle \ldots \rangle$ represents the average across ensembles, and $I_{n_c}$ is the identity matrix of size $n_c$-by-$n_c$.

In MR inverse imaging ("InI") according to the present invention, the spatial locations corresponding to elements of x(t) constitute a source space. In practice, the source space can be a 3-dimensional volumetric space representing multiple partitions in conventional 3D MRI. This 3D InI source space corresponds to using non-selective excitation over the whole volume-of-interest (VOI) and acquires only the central point of the k-space volume for InI reconstruction. It is also possible to have a 2-dimensional planar InI source space if a slice selection gradient is employed in the pulse sequence to constrain the image to be reconstructed from a single plane (2D InI). Moreover, a 1-dimensional linear InI source space is possible if both slice selection and frequency-encoding gradients are employed in the pulse sequence (1D InI). Coil sensitivity profiles are used to resolve this uncertainty. Finally, incorporating a limited amount of phase encoding steps, such as in traditional parallel MRI SENSE/MASH/GRAPPA, InI source space can be further restricted.

In dynamic MR imaging where a series of time resolved images is acquired, a priori information about the subject in the FOV is usually available. The incorporation of such a priori information can improve the image reconstruction quality in anatomical and dynamic functional MRI. The option of using a priori information can be included in the dynamic InI framework. Denoting the time-invariant prior for the solution by $x_0$, the forward problem can be re-written as:

$$y'_w(t) = A_w x'(t) + n_w(t)$$

$$y'_w(t) = y_w(t) - A_w x_0$$

$$x'(t) = x(t) - x_0$$

$$y'(t) = y(t) - A x_0. \quad (4)$$

The subsequent derivation of the minimum-norm solution will incorporate the a priori information to yield time-resolved images x(t). However, if no prior information is available, a "baseline interval" can be employed to estimate the $A_w x_0$ term. For example, the averaged InI accelerated measurements over a baseline interval generates the averaged baseline activity estimate, which is subtracted from the dynamic InI measurements in an "activity interval" to generate $y'_w(t)$. In the following section, it will be shown that the spatial distribution of the dynamic change can still be resolved simply based on $y'_w(t)$ without a spatial prior, $x_0$.

The stability of the solution for x'(t) depends on the condition of the forward operator. Traditional parallel MRI methods limit the forward operator such that $A_w$ has more rows than columns. In practice, this constrains the acceleration rate (r) to be less than or equal to the number of coils in the array ($n_c$). Mathematically, this is equivalent to the requirement of the existence of $(A_w^H A_w)^{-1}$. This is explicitly required in the SENSE and GRAPPA image reconstruction methods. Nevertheless, in extremely accelerated cases, the Fourier encoding matrix has a very small number of rows, and thus $(A_w^H A_w)$ is very ill-conditioned. In other words, dynamic InI may encounter the inverse problem where there are more unknowns than observations. In light of the ill-posed dynamic InI, a solution can be approached by introducing constraints. One common choice is the linear minimum-norm estimate, which minimizes the following cost function:

$$\hat{x}'(t) = \arg_x \min\{\|y'_w(t) - A_w x'(t)\|_2^2 + \lambda^2 \|x'(t)\|_2^2\} \quad (5)$$

Where $\| \ldots \|_2^2$ is the square of the $l_2$-norm and $\lambda^2$ is a regularization parameter. The cost function consists of two parts: the first is the model error term, which quantifies the discrepancy between measured data and modeled error, and the second is the prior error term, which quantifies the solution deviation from the prior. The second term in the cost function implies searching a solution that minimizes the deviation from the prior. The "minimum-norm" estimate, $\hat{x}'(t)$, thus corresponds to a solution with minimum cost. The solution is provided by the linear inverse operator $W_w$:

$$\hat{x}'(t) = W_w y'_w(t).$$

The ill-conditioned dynamic InI problem set forth above can alternatively be solved using a linear constrained minimum variance (LCMV) beamforming method. In this method, the point-spread function of the reconstruction kernel is minimized by suppressing signal leakage from all image voxels other than the one currently being reconstructed. An exemplary LCMV beamformer is described below and further, for example, in Van Veen BD, et al., IEEE Trans. Biomed. Engr., 1997; 44(9):867-880.

For a each image voxel, a spatial filter W(ρ) is calculated that is employed to reconstruct the intensity of the $\rho^{th}$ voxel. This is achieved by minimizing the following cost function:

$$W(\rho)^H \cdot (D + \lambda^2 C) \cdot W(\rho), \quad (6)$$

Subject to the following constraint:

$$W(\rho)^H A(\rho') = \begin{cases} 1, & \rho = \rho' \\ 0, & \rho \neq \rho' \end{cases} \quad (7)$$

Where $A(\rho')$ is the forward operator for the $\rho^{th}$ voxel. In equation (6), $\lambda^2$ is again a regularization parameter, and D is a data covariance matrix, which has the form:

$$D = \langle x'(t) \cdot x'(t)^H \rangle = \langle x(t) \cdot x(t)^H \rangle. \quad (8)$$

An analytical solution to equation (6) is attainable with the constraint provided by equation (7). Thus, the analytical solution for $W(\rho)$ has the form:

$$W(\rho) = \frac{A(\rho)^H \cdot (D + \lambda^2 C)^{-1}}{A(\rho)^H \cdot (D + \lambda^2 C)^{-1} \cdot A(\rho)}. \quad (9)$$

The calculated spatial filter, $W(\rho)$, can thus be employed on a voxel-by-voxel basis to reconstruct the time series of images, x'(t), from the corresponding data y'(t) as:

$$x'(t) = W(\rho)^H \cdot y'_w(t). \quad (10)$$

Traditional dynamic MRI image reconstruction provides a series of time-resolved images where subsequent statistical analysis on the time series of images yields statistical parametric maps (SPMs). However, in InI, reconstructed time series of images can be normalized to a noise estimate to obtain SPMs at every time point. In this situation, the spatial filter, $W(\rho)$, is modified to be noise-normalized as:

$$W(\rho)_{dSPM} = \frac{W(\rho)}{\sqrt{W(\rho)^H \cdot C \cdot W(\rho)}}. \quad (11)$$

DETAILED DESCRIPTION OF THE PREFERRED EMBODIMENT

Referring particularly to FIG. 1, the preferred embodiment of the invention is employed in an MRI system. The MRI system includes a workstation 10 having a display 12 and a keyboard 14. The workstation 10 includes a processor 16 that is a commercially available programmable machine running a commercially available operating system. The workstation 10 provides the operator interface that enables scan prescriptions to be entered into the MRI system. The workstation 10 is coupled to four servers: a pulse sequence server 18; a data acquisition server 20; a data processing server 22, and a data store server 23. The workstation 10 and each server 18, 20, 22 and 23 are connected to communicate with each other.

The pulse sequence server 18 functions in response to instructions downloaded from the workstation 10 to operate a gradient system 24 and an RF system 26. Gradient waveforms necessary to perform the prescribed scan are produced and applied to the gradient system 24 that excites gradient coils in an assembly 28 to produce the magnetic field gradients $G_x$, $G_y$ and $G_z$ used for position encoding MR signals. The gradient coil assembly 28 forms part of a magnet assembly 30 that includes a polarizing magnet 32 and a whole-body RF coil 34.

RF excitation waveforms are applied to the RF coil 34 by the RF system 26 to perform the prescribed magnetic resonance pulse sequence. Responsive MR signals detected by the RF coil 34 or a separate local coil (not shown in FIG. 1) are received by the RF system 26, amplified, demodulated, filtered and digitized under direction of commands produced by the pulse sequence server 18. The RF system 26 includes an RF transmitter for producing a wide variety of RF pulses used in MR pulse sequences. The RF transmitter is responsive to the scan prescription and direction from the pulse sequence server 18 to produce RF pulses of the desired frequency, phase and pulse amplitude waveform. The generated RF pulses may be applied to the whole body RF coil 34 or to one or more local coils or coil arrays (not shown in FIG. 1).

The RF system 26 also includes one or more RF receiver channels. Each RF receiver channel includes an RF amplifier that amplifies the MR signal received by the coil to which it is connected and a detector that detects and digitizes the I and Q quadrature components of the received MR signal. The magnitude of the received MR signal may thus be determined at any sampled point by the square root of the sum of the squares of the I and Q components:

$$M = \sqrt{I^2 + Q^2},$$

and the phase of the received MR signal may also be determined:

$$\phi = \tan^{-1}\left(\frac{Q}{I}\right).$$

The pulse sequence server 18 also optionally receives patient data from a physiological acquisition controller 36. The controller 36 receives signals from a number of different sensors connected to the patient, such as ECG signals from electrodes or respiratory signals from a bellows. Such signals are typically used by the pulse sequence server 18 to synchronize, or "gate", the performance of the scan with the subject's respiration or heart beat.

The pulse sequence server 18 also connects to a scan room interface circuit 38 that receives signals from various sensors associated with the condition of the patient and the magnet system. It is also through the scan room interface circuit 38 that a patient positioning system 40 receives commands to move the patient to desired positions during the scan.

The digitized MR signal samples produced by the RF system 26 are received by the data acquisition server 20. The data acquisition server 20 operates in response to instructions downloaded from the workstation 10 to receive the real-time MR data and provide buffer storage such that no data is lost by data overrun. In some scans the data acquisition server 20 does little more than pass the acquired MR data to the data processor server 22. However, in scans that require information derived from acquired MR data to control the further performance of the scan, the data acquisition server 20 is programmed to produce such information and convey it to the pulse sequence server 18. For example, during prescans MR data is acquired and used to calibrate the pulse sequence performed by the pulse sequence server 18. Also, navigator signals may be acquired during a scan and used to adjust RF or gradient system operating parameters or to control the view order in which k-space is sampled. And, the data acquisition server 20 may be employed to process MR signals used to detect the arrival of contrast agent in an MRA scan. In all these examples the data acquisition server 20 acquires MR data and processes it in real-time to produce information that is used to control the scan.

The data processing server 22 receives MR data from the data acquisition server 20 and processes it in accordance with instructions downloaded from the workstation 10. Such processing may include, for example: Fourier transformation of raw k-space MR data to produce two or three-dimensional images; the application of filters to a reconstructed image; the performance of a backprojection image reconstruction of acquired MR data; the calculation of functional MR images; the calculation of motion or flow images, etc.

Images reconstructed by the data processing server 22 are conveyed back to the workstation 10 where they are stored. Real-time images are stored in a data base memory cache (not shown) from which they may be output to operator display 12 or a display 42 that is located near the magnet assembly 30 for use by attending physicians. Batch mode images or selected real time images are stored in a host database on disc storage 44. When such images have been reconstructed and transferred to storage, the data processing server 22 notifies the data store server 23 on the workstation 10. The workstation 10 may be used by an operator to archive the images, produce films, or send the images via a network to other facilities.

To achieve an order-of-magnitude speedup in the acquisition of time-resolved MR images, spatial resolution is achieved using a multi-element RF coil array as an NMR signal detector rather than the usual time consuming image gradient encoding methods. The characteristics of the RF coil array that lend it to this application are as follows. A number coil elements are needed surrounding the object as completely as possible in a densely tiled arrangement. The spatial resolution of the invention is expected to increase as the number of spatially disparate detectors is increased. To provide spatially disparate information, the array elements should be uncoupled from one another. To provide both sensitivity and improved spatial information, the coils should be as close to the object as possible. If the array elements are for reception only, they should be detuned during the transmit phase of the MR experiment.

Figure 4:
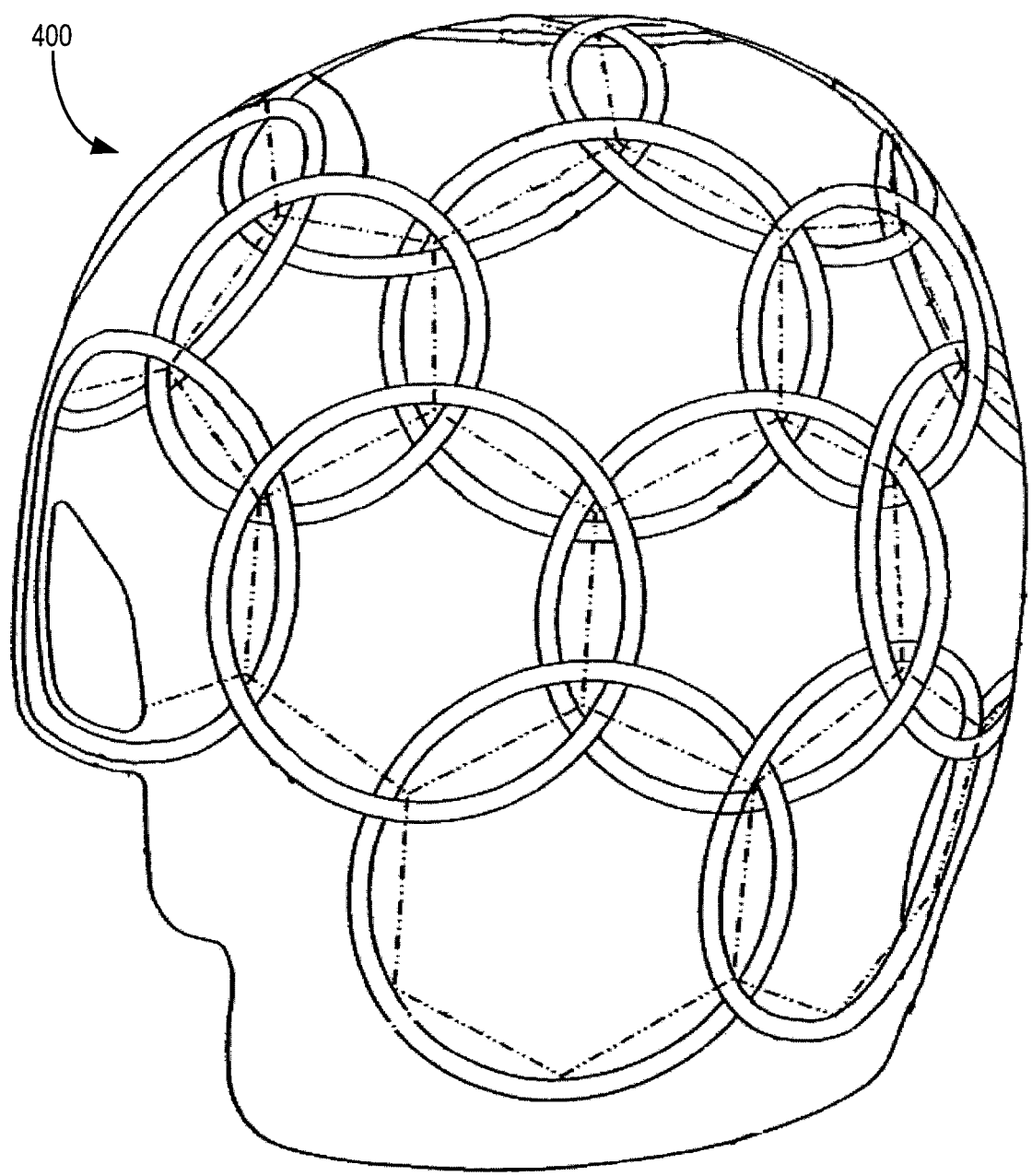
FIG. 4 is a pictorial representation of a 90-element coil used with the MRI system of FIG. 1 to practice the preferred embodiment of the invention.

Referring particularly to FIG. 4, in the preferred embodiment of the invention a coil array 400 in the shape of a helmet is used to acquire images from the human brain. The close-fitting fiberglass helmet is modeled after the European head standard from EN960/1994 for protective headgear. This coil array 400 has 90 separate RF coil elements that are positioned over the curved helmet surface. Each coil element is substantially circular in shape and adjacent coil elements overlap such that their mutual inductance is minimized. As described in co-pending U.S. patent application Ser. No. 11/579,576 filed on Nov. 2, 2006 and entitled "MRI Polyhedral Coil Array Positioning With Non-Zero Gaussian Curvature", inductive coupling between coil elements is reduced by overlapping adjacent coil elements and using preamplifier decoupling. The cable leading from each of the 90 coil elements to the preamplifier in its corresponding receiver channel is carefully chosen and the tuning of the matching circuit to the preamplifier is chosen to transform the high preamplifier input impedance to a low impedance across the circular coil element. An arrangement of hexagonal and pentagonal tiles cover the helmet surface, similar to a geodesic tiling of a sphere. Each tile has sides that are approximately 23 mm long although it was necessary to distort the pentagonal tiles is places in order to map them onto the surface of the helmet. A circular surface coil is centered on each one of the tiles. Each surface coil is made from 0.031 inch thick G10 copper clad circuit board with a conductor width of 2.5 mm. The diameter of each coil element ranges from 4.5 cm to 5.5 cm. It has been found that significant 5 to 8-fold gains in SNR are possible with this structure as compared to conventional head coils, particularly in the cerebral cortex.

In the preferred embodiment a series of MR images are acquired of the subject's brain while the subject is performing a prescribed function or while the subject is stimulated in a prescribed manner. MR data for a complete image is acquired each 20 msecs. during the dynamic study so that a high temporal resolution of the resulting brain activity is detected. Because the echo time (TE) needed to obtain maximum BOLD NMR signal response is much longer than 20 msecs (e.g., 43 msecs at 1.5T) a PRESTO echo-shifting pulse sequence, such as the one disclosed, for example, in Liu G, et al., "A functional MRI technique combining principles of echo-shifting with a train of observations (PRESTO)", Magn. Reson. Med. 1993; 30(6):764-8, is used.

Figure 5:
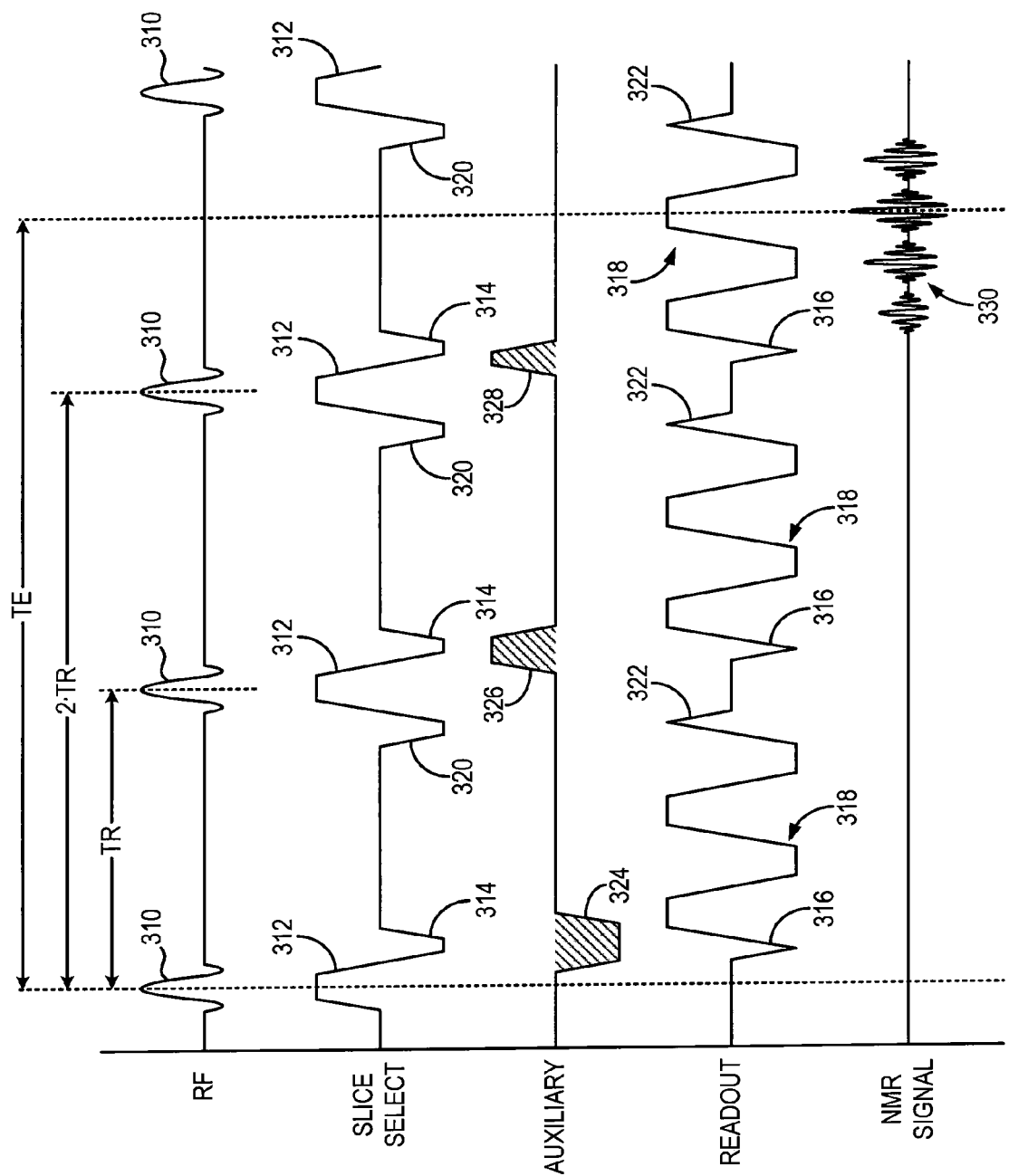
FIG. 5 is a graphic representation of a pulse sequence used to direct the MRI system of FIG. 1 when practicing the preferred embodiment.

Referring particularly to FIG. 5, the pulse sequence begins by producing transverse magnetization in a slice through the subject by applying a 20 degree RF excitation pulse 310 in the presence of a slice selective gradient 312. The slice selective gradient 312 is followed by a rephasing gradient 314. While the rephasing gradient 314 is played out, a negative readout gradient lobe 316 is produced in the readout direction. The negative readout gradient lobe 316 is subsequently followed by a series of alternating readout gradients 318. After the readout gradients 318 have played out, a second rephasing lobe 320 is produced in the slice select direction and a positive readout gradient lobe 322 is produced in the readout direction. The purpose of the first and second rephasing gradients, 314 and 320, and the negative and positive readout gradient lobes, 316 and 322, are such that the net gradient waveform area for each gradient axis (e.g., slice select and readout) is zero during each repetition time (TR) interval. As a result of these zeroed gradient waveforms, auxiliary gradients can be employed during each TR interval to actively dephase the transverse magnetization such that a shifted echo time (TE) is achieved. The auxiliary gradients can be played out along any gradient axis and can alternatively be played out as a combination of gradient waveforms on more than one specific gradient axis.

In the preferred embodiment, a first auxiliary gradient pulse 324 and a second auxiliary gradient pulse 326 are set to shift the echo time (TE) two TR periods, where a third auxiliary gradient 328 produces an echo train 330. This is achieved by setting the gradient area of the first auxiliary gradient 324 to $-3 \cdot A$ to spoil the transverse magnetization produced by the RF excitation pulse 310. The second auxiliary gradient 326 has an area of $2 \cdot A$ and thus partially rephases the transverse magnetization. After the application of the third auxiliary gradient 328, which has a gradient area of A, the transverse magnetization rephases at the now shifted echo time, TE. Data acquisition is only performed during the application of the alternating readout gradients 318 that are played out in the presence of an echo train and the NMR signals corresponding to the echo train 330 are acquired separately by each of the 90 coil elements and each is slightly different due to the different location of each coil element. The result of such a pulse sequence is to increase $T_2^*$-Weighting of the acquired image data, making it desirable to functional MRI (fMRI) data acquisitions. There is no phase encoding gradient in this pulse sequence, and therefore a scan for one image frame includes an application of the pulse sequence in which a straight line through the center of k-space is sampled. This is referred to herein as a 1D InI scan in which one gradient encoding axis is eliminated by using the present invention.

Figure 6:
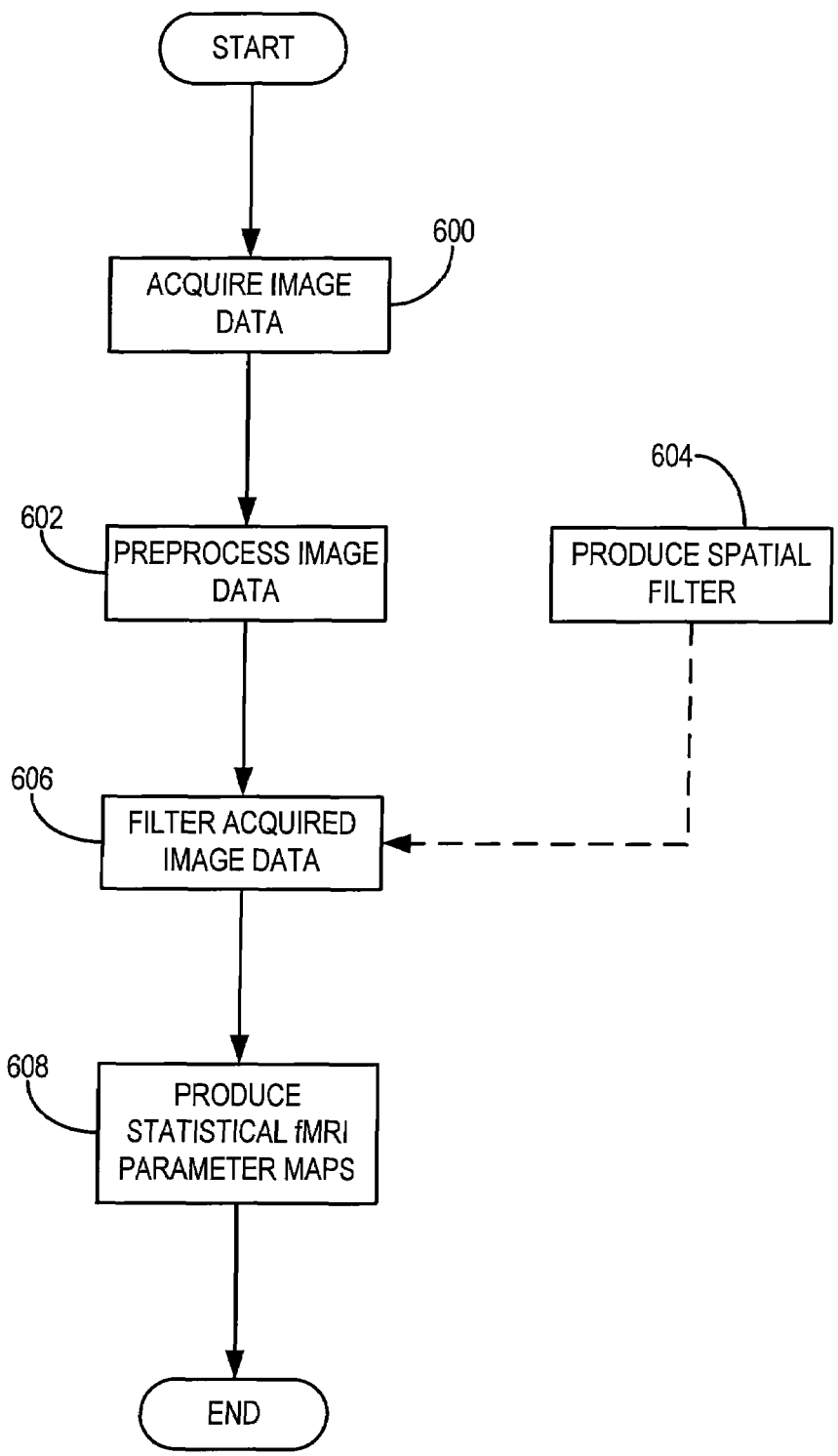
FIG. 6 is a flow chart which illustrates the steps used in the preferred embodiment of the invention.

Referring particularly to FIG. 6, the first step in a preferred fMRI implementation of the present invention is to acquire a series of image frames in a 1D InI scan as indicated at process block 600. This is accomplished using the above-described pulse sequence and the resulting 1D array of complex k-space samples from each of the 90 receivers and each of the acquired image frames is stored.

Figure 7:
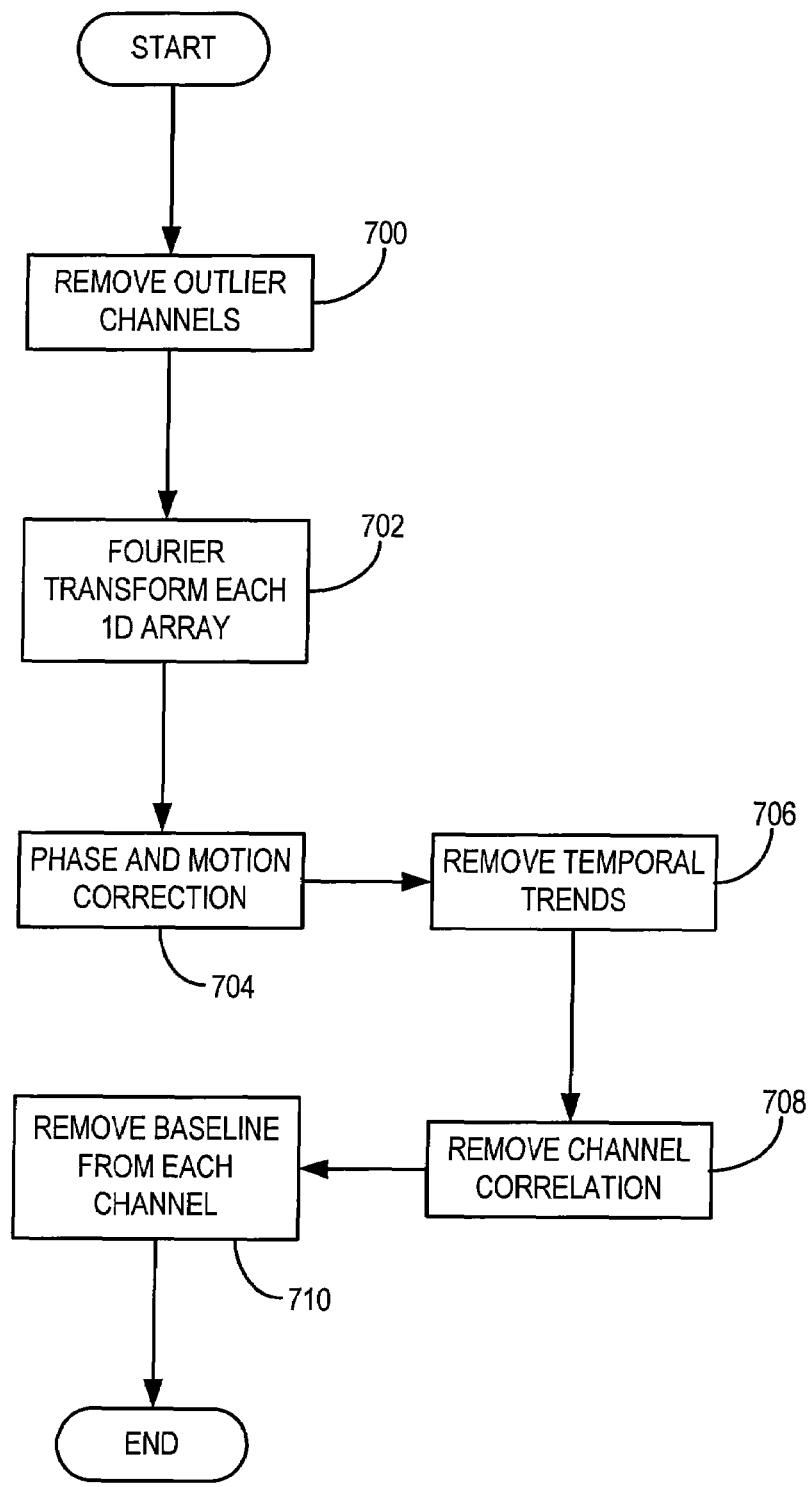
FIG. 7 is a flow chart of the steps used to prepare acquired k-space data.

Prior to reconstructing image frames from this k-space data using the spatial filter calculated from the LCMV beamformer, the k-space data is prepared as indicated at process block 602. The nature of this preparation depends to some extent on the particular scan being performed, but in the fMRI scan of the preferred embodiment, the preparation steps are illustrated in FIG. 7. As indicated at process block 700 in FIG. 7, this includes removing, from the acquired k-space data, any channels with bad measurements. This is accomplished by searching through the data from each channel and eliminating from consideration any channel with increased noise or decreased signal.

As indicated at process block 702, the 1D array of k-space data for each channel in each image frame is then Fourier transformed. This is a standard complex FFT which preserves the phase information in the I and Q components of the resulting signal samples. Each resulting signal sample is spatially resolved along the slice select axis and the readout gradient axis and the present invention is employed as described below to spatially resolve these signals along the third axis.

As indicated at process block 704, the preparation phase continues by aligning the phase of corresponding signal samples in each channel. This is accomplished by rotating each complex data point to have the same phase as the other time-points which occur at the same latency with respect to the reference waveform. Phase alignment reduces phase instabilities in the data which may occur in the repetitive measurement.

As indicated at process block 706, the acquired fMRI data is corrected for subject motion and other physiological noises. This is accomplished by correcting the phase of each signal sample in each image frame by an amount which offsets any detected patient motion during acquisition of each image frame. This is a well known correction common to fMRI post processing. For example, navigator signals can be periodically acquired during the scan as described in U.S. Pat. No. 5,539,312 and used to phase correct the fMRI data for patient motion. Similarly, as indicated by process block 708, the acquired fMRI image frames are further corrected by removing temporal trends in the data that appear over the entire acquisition time. This is accomplished by detrending the time-series by subtracting a fitted polynomial or other set of basis functions from the data.

As indicated at process block 710, the data preparation continues by calculating a noise covariance matrix C among the receiver channels, which is employed when calculating the spatial filter, W(ρ), and acts to remove the spatial correlation between channels in the array. This can be achieved by digitizing the signal for a short period in the absence of RF excitation.

And finally, as indicated at process block 712, a baseline measurement is removed from each channel in each image frame as set forth above in Equation (4). In the fMRI scan a baseline measurement is typically made at the beginning of the scan before the patient is stimulated or starts a prescribed task. The corresponding signal samples in the 1D array of channel baseline measurements is subtracted from the corresponding channel measurements in each image frame. This is a complex subtraction that preserves the phase information. This completes the preparation phase of the acquired data which is now ready for inversion.

A key step in image reconstruction process is the transformation of the acquired data using a spatial filter, W(ρ). Referring again to FIG. 6, many of the calculations needed to produce the spatial filter, W(ρ), need only be calculated once and can be stored for later use. However, some of the calculations are subject dependent and receive coil dependent and must be calculated for each subject scan as indicated at process block 604. The steps required to accomplish this are set forth in FIG. 8.

Figure 8:
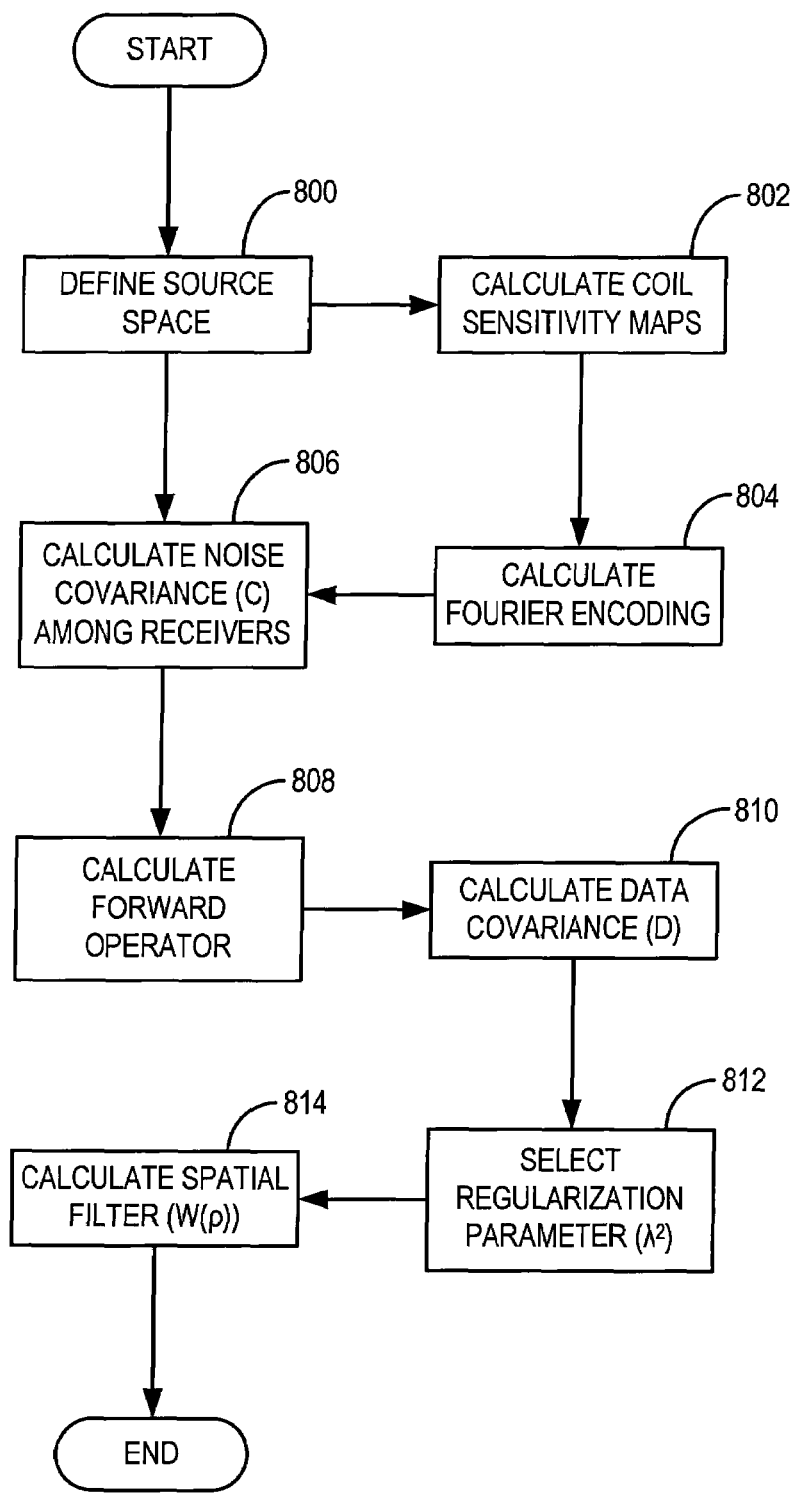
FIG. 8 is a flow chart which illustrates the steps used to prepare the spatial filter in the method of FIG. 6

Referring now to FIG. 8, to construct a spatial filter, W(ρ), source space is defined first in block 800. The source space represents possible locations in which the image will be reconstructed. In the most general case, the source space is the field of view of the image reconstructed with the present invention. If the spatial prior restricts this information, then the source space is reduced. For example, if only a limited number of spatial locations are expected to have dynamic change, then the source space may be restricted to this region. Restriction of the source space is beneficial for speeding up the inverse calculation and as a way to incorporate prior knowledge about the processes being studied by the image.

The construction continues by calculating coil sensitivity maps. Coil sensitivity maps, $P_n$, in equation (2) are calculated as indicated at process block 802. The spatial sensitivity patterns of a coil can be estimated from low resolution MR images (magnitude and phase) acquired with minimal tissue contrast. If desired, anatomic information can be removed from this map by comparing to a similar scan acquired with the uniform body RF coil.

In addition, the Fourier encoding matrix, E, described in equation (2) is produced, as indicated in block 804. This can be done by using discrete Fourier transform matrix and a given k-space sampling pattern, as described in equation (2). The spatial correlation among channels in the forward operator is removed by using the noise covariance matrix, C, described above. The noise covariance matrix, C, is calculated at process block 806 and subsequently employed to calculate the spatial filter, W(ρ). Next, as indicated in process block 808, the forward operator, A, is calculated in accordance with equation (2), where the multiplication of the Fourier encoding matrix, E, and the coil sensitivity map, $P_n$, is done for each channel in the array. The collection of all such multiplications from all channels in the array constitute the forward operator A, as described in equation (2). As indicated at process block 810, the next step is to calculate the data covariance matrix, D, as set forth above in equation (8). The data covariance matrix may be constructed by a stationary full field of view image indicating the spatial distribution of the likelihood of the dynamic change. If a spatial prior is not desired, the identity matrix can be used.

To obtain the spatial filter, W(ρ), a regularization parameter $\lambda^2$ is additionally calculated, as indicated by block 812. This is because in general an under-determined system is being dealt with, and thus, without a regularization parameter, the matrix between the problem may become ill-conditioned. A regularization parameter can be estimated using an approach, such as an L-curve, generalized cross-validation, singular-value decomposition, or truncated singular-value decomposition.

Having determined the regularization parameter $\lambda^2$, noise covariance matrix, C, data covariance matrix D, and the forward operator A, the spatial filter W(ρ) is now calculated, as described in equation (9), and as indicated at process block 814.

Referring again to FIG. 6, the next step is to apply the spatial filter, W(ρ), to the prepared image frame data as indicated at process block 606 using equation (10). In equation (10) W(ρ) is the spatial filter and y'(t) is the prepared data. The result of this operation is the production of x'(t), a 2D image at each time frame in the dynamic study in which each image pixel indicates the BOLD response at the corresponding voxel in the subject's brain. When applied to the prepared data, the calculated spatial filter, W(ρ), restores, in this example, the spatial localization information lost by acquiring image data without phase encoding gradients. The same spatial filter is used repetitively to transform the prepared time series data into time series images.

The last step in the fMRI process is to calculate statistical parameter maps as indicated at process block 608. This is done in accordance with the modified spatial filter presented in equation (11). First, an estimate of the noise is calculated as the denominator of equation (11), that is:

$$\epsilon(\rho) = \sqrt{W(\rho\rho)^H \cdot C \cdot W(\rho)}.$$

The reconstructed images, x'(t), are then divided by the estimated noise, $\epsilon(\rho)$ through an element-wise division. The resulting dynamic statistical parametric maps (dSPMs) are t-distributed under the null hypothesis of no hemodynamic response.

While the present invention is particularly useful in fMRI applications, it is also useful in other applications where very high temporal resolution is needed. In addition to eliminating the need for gradients to spatially encode for one, two or three axes, the present invention can also be employed in situations where gradient spatial encoding is not eliminated, but merely reduced in resolution. For example, rather than eliminating the phase encoding gradient entirely as is done in the above preferred embodiment, a limited number of phase encoding steps may be employed to increase spatial resolution. The greater the number of phase encoding steps used the longer the scan time and the higher the resolution of the acquired frame images. The choice is thus a trade off between image resolution on the one hand and scan time or temporal resolution.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for producing an image of a subject with a magnetic resonance imaging (MRI) system, the steps comprising:
    a) performing a pulse sequence with the MRI system to produce transverse magnetization in the subject that emits NMR signals;
    b) acquiring the NMR signals simultaneously with multiple coils and associated receive channels;
    c) producing a prepared data set from the received NMR signals;
    d) reconstructing an image from the prepared data set by applying a spatial filter; and
    wherein the spatial filter suppresses signal leakage from substantially all voxels in the image other than a voxel being reconstructed.

2. The method as recited in claim 1 in which step c) includes:
    c)i) Fourier transforming the acquired NMR signals.

3. The method as recited in claim 1 in which performing the pulse sequence in step a) includes:
    a)i) applying an image gradient along one axis to position encode the NMR signals acquired in step b); and
    step c) includes:
    c)i) Fourier transforming the acquired NMR signals.

4. The method as recited in claim 3 in which the image gradient is applied as the NMR signals are acquired.

5. The method as recited in claim 1 in which the pulse sequence does not employ an image gradient to resolve NMR signal position along one image axis and NMR signal position is resolved along said image axis by application of the spatial filter in step d).

6. The method as recited in claim 1 in which step c) includes:
    c)ii) aligning the phase of corresponding NMR signals from each coil.

7. The method as recited in claim 1 in which step c) includes:
    c)iii) removing spatial correlations between the NMR signals in each receive channel.

8. The method as recited in claim 7 in which step c)iii) includes calculating a noise covariance matrix among the receive channels.

9. The method as recited in claim 1 which further includes:
    e) calculating the spatial filter by:
    e)i) calculating a coil sensitivity map for each of said multiple coils;
    e)ii) producing a forward operator, A, from the coil sensitivity maps; and
    e)iii) producing a spatial filter using the forward operator, A.

10. The method as recited in claim 9 in which step e)iii) includes:
    calculating a noise covariance matrix, C, which is indicative of spatial correlations between the receive channels; and
    wherein the spatial filter is produced from the forward operator, A, and the noise covariance matrix, C.

11. The method as recited in claim 9 in which step e)iii) includes:
    calculating a data covariance matrix, D, using known information about the subject being imaged; and
    wherein the spatial filter is produced from the forward operator, A, and the data covariance matrix, D.

12. The method as recited in claim 9 in which step e)iii) includes:
    calculating a regularization parameter, 22; and
    wherein the spatial filter is produced using the regularization parameter, $\lambda^2$.

13. The method as recited in claim 1 in which the spatial filter is a linear constrained minimum variance beamformer.

14. The method as recited in claim 1 in which steps a) and b) are repeated to acquire a series of time course NMR signals, and steps c) and d) are performed on each set of NMR signals to produce a corresponding series of images.

15. The method as recited in claim 14 in which the subject is the brain of a human who is subjected to an activation pattern and the series of images indicate brain activity resulting from the activation pattern.

* * * * *